United States Patent
Kinoshita et al.

(10) Patent No.: US 7,193,361 B2
(45) Date of Patent: Mar. 20, 2007

(54) ORGANIC ELECTROLUMINESCENCE DEVICE AND ORGANIC ELECTROLUMINESCENCE DISPLAY

(75) Inventors: Masaru Kinoshita, Kawasaki (JP); Yuichiro Itai, Kawasaki (JP); Masaya Nakayama, Kawasaki (JP); Jun Kodama, Kawasaki (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 11/039,943

(22) Filed: Jan. 24, 2005

(65) Prior Publication Data
US 2005/0122038 A1    Jun. 9, 2005

Related U.S. Application Data

(63) Continuation of application No. PCT/JP02/13546, filed on Dec. 25, 2002.

(51) Int. Cl.
*H05B 33/00* (2006.01)
(52) U.S. Cl. .................. 313/504; 313/506; 428/917
(58) Field of Classification Search ............ 313/503, 313/504, 506; 428/917
See application file for complete search history.

(56) References Cited

U.S. PATENT DOCUMENTS 5,343,050 A * 8/1994 Egusa et al. ............... 257/40
6,558,219 B1 * 5/2003 Burroughes et al. ......... 445/24
6,597,109 B1 * 7/2003 Arai et al. .................. 313/506
6,723,445 B2 * 4/2004 Li et al. ..................... 428/490
6,805,977 B2 * 10/2004 Sotoyama et al. ........... 428/690

FOREIGN PATENT DOCUMENTS

| JP | 63-231898  | 9/1988  |
|----|------------|---------|
| JP | 1-265494   | 10/1989 |
| JP | 5-326146   | 12/1993 |
| JP | 6-36877    | 2/1994  |
| JP | 7-192871   | 7/1995  |
| JP | 11-162645  | 6/1999  |
| JP | 2000-30868 | 1/2000  |

* cited by examiner

*Primary Examiner*—Ashok Patel
(74) *Attorney, Agent, or Firm*—Westerman, Hattori, Daniels & Adrian LLP

(57) ABSTRACT

The present invention is an organic EL device in which an anode, a hole injection layer, a first carrier transportation layer, a first luminescent layer, a second carrier transportation layer, a second luminescent layer, an electron transportation layer, and a cathode are formed on a glass substrate in order, wherein layers with a smaller electron affinity Ea and a larger energy gap Eg than those of the first and second luminescent layers are employed for the first and second carrier transportation layers, so as to enhance the emission efficiency of the first and second luminescent layers.

4 Claims, 11 Drawing Sheets

10 ORGANIC EL DEVICE

30 ORGANIC EL DEVICE

FIG.7

| LAYER MATERIAL | ELECTRON AFFINITY Ea(eV) | ENERGY GAP Eg(eV) | IONIZATION POTENTIAL Ip(eV) |
|---|---|---|---|
| 2-TNATA LAYER | 2.19 | 3.00 | 5.19 |
| α-NPD LAYER | 2.42 | 3.04 | 5.46 |
| TYG-201 LAYER | 3.20 | 2.40 | 5.60 |

FIG.8

| | MATERIAL | FILM THICKNESS | |
| --- | --- | --- | --- |
| | | 2ND EXAMPLE | 3RD EXAMPLE |
| ANODE | ITO | 150nm | 150nm |
| HOLE INJECTION LAYER | 2-TNATA | 50nm | 50nm |
| 1ST CARRIER TRANSPORTATION LAYER | α-NPD | 10nm | 10nm |
| 1ST LUMINESCENT LAYER | TYG-201 | 10nm | 5nm |
| 2ND CARRIER TRANSPORTATION LAYER | α-NPD | 10nm | 5nm |
| 2ND LUMINESCENT LAYER | TYG-201 | 10nm | 5nm |
| 3RD CARRIER TRANSPORTATION LAYER | α-NPD | 10nm | 5nm |
| 3RD LUMINESCENT LAYER | TYG-201 | 20nm | 5nm |
| 4TH CARRIER TRANSPORTATION LAYER | α-NPD | | 5nm |
| 4TH LUMINESCENT LAYER | TYG-201 | | 5nm |
| 5TH CARRIER TRANSPORTATION LAYER | α-NPD | | 5nm |
| 5TH LUMINESCENT LAYER | TYG-201 | | 20nm |
| ELECTRON TRANSPORTATION LAYER | TYE-704 | 30nm | 30nm |
| CATHODE | LITHIUM FLUORIDE | 0.5nm | 0.5nm |
| | Al | 100nm | 100nm |

|  | GREENLY LUMINESCENT LAYER | LUMINANCE OF LUMINESCENCE (cd/m²) |
|---|---|---|
| 1ST EXAMPLE | 2 | 3800 |
| 2ND EXAMPLE | 3 | 3900 |
| 3RD EXAMPLE | 5 | 4010 |
| COMPARISON EXAMPLE | 1 | 3100 |

| LAYER MATERIAL | ELECTRON AFFINITY Ea(eV) | ENERGY GAP Eg(eV) | IONIZATION POTENTIAL Ip(eV) |
|---|---|---|---|
| TYG-201 LAYER | 3.20 | 2.40 | 5.60 |
| TYE-704 LAYER | 2.97 | 2.76 | 5.73 |

60 ORGANIC EL DISPLAY

ORGANIC ELECTROLUMINESCENCE DEVICE AND ORGANIC ELECTROLUMINESCENCE DISPLAY

CROSS-REFERENCE TO RELATED APPLICATIONS

The present application is a U.S. continuation application filed under 35 U.S.C. 111(a) claiming benefit under 35 U.S.C. 120 and 365(c) of International Patent Application No. PCT/JP02/13546 filed on Dec. 25, 2002, the entire contents of which are hereby incorporated by reference.

BACKGROUND OF THE INVENTION

1. Field of the Invention

The present invention relates to an organic electroluminescence device and an organic electroluminescence display, and in particular relates to an organic electroluminescence device and organic electroluminescence display in which a plurality of luminescent layers and/or carrier transportation layers are formed between an anode and a cathode.

2. Description of the Related Art

An organic electroluminescence device (, wherein the organic electroluminescence device will be referred to as an "organic EL device" below,) that is easy to miniaturize, has low electrical power consumption, is capable of surface emission, and can use greatly reduced applied voltage compared to a liquid crystal device, and that can be utilized in various kinds of display devices such as a flat display, etc., has attracted attention, and research and development as a next generation luminescent device have been conducted.

FIG. 1 shows a cross-sectional view of a conventional organic EL device. As shown in FIG. 1, the conventional organic EL device 10 has a structure such that an anode 12 made from transparent ITO (Indium Tin Oxide), etc., a hole transportation layer 13, a luminescent layer 14, an electron transportation layer 15, and a cathode 16 are stacked on a transparent glass substrate 11 in order. The hole transportation layer 13 efficiently transports holes to the luminescent layer 14 so as to increase the hole density while the electron transportation layer 15 efficiently transports electrons to the luminescent layer 14 so as to increase the spatial electron density so that the emission efficiency is enhanced. Also, a technology such that a layer for stemming electrons is provided between a luminescent layer and a luminescent layer so as to try to improve the emission efficiency in the luminescent layers has been proposed.

FIG. 2 is a drawing that shows an energy diagram of the organic EL device shown in FIG. 1. As a voltage is applied to the organic EL device 10, the holes 22 move from the anode 12 toward the luminescent layer while the electrons 21 move from the cathode 16 toward the luminescent layer. As the electrons 21 and the holes 22 reach the luminescent layer 14, an organic phosphor contained in the luminescent layer 14 is excited and emits light due to energy released by the recombination of the electrons 21 and the holes 22.

By the way, among the electrons 21 and the holes 22, electrons 21 brought to the anode 12 and holes 22 brought to the cathode 16 without recombining in the luminescent layer 14 are present as shown in FIG. 2 and consumed without contributing to luminescence, so that there is a problem in that the luminance per unit of electric current consumption, that is, the emission efficiency, is lowered.

Additionally, there is also a problem that electrons and holes that have not recombined in the luminescent layer recombine in the hole transportation layer 13 and the electron transportation layer 15, so as to emit luminescence with a color different from a desired color.

SUMMARY OF THE INVENTION

Consequently, it is a general object of the present invention made by considering the aforementioned problems to provide an organic electroluminescence device and organic electroluminescence display for reducing electrons and holes that do not contribute to the luminescence, for making the recombination of electrons and holes efficient in a luminescent layer, and being excellent in emission efficiency.

A more specific object of the present invention is to provide an organic electroluminescence device with a plurality of luminescent layers formed between an anode and a cathode that oppose each other and a carrier transportation layer formed to contact the luminescent layer on the anode side, wherein the relationship of an electron affinity of the luminescent layer $Ea_{EML}$ and an electron affinity of the carrier transportation layer $Ea_{OL1}$ is $Ea_{EML} > Ea_{OL1}$.

Herein, the electron affinity is the energy difference between a conduction level (the energy of the lowest edge of a conduction band) of a luminescent layer or a carrier transportation layer and a vacuum level and denoted by a positive value.

According to the present invention, a carrier transportation layer having an electron affinity $Ea_{OL1}$ smaller than an electron affinity $Ea_{EML}$ of a luminescent layer is formed on the luminescent layer on the side of an anode. Accordingly, an energy barrier is provided at the interface through which the electrons pass from the luminescent layer to the carrier transportation layer and the electrons are stored in the luminescent layer so as to increase the spatial electron density. As a result, electrons that recombine with holes increase so that the emission efficiency of the luminescent layer can be enhanced.

Another object of the present invention is to provide an organic electroluminescence device with a plurality of luminescent layers formed between an anode and a cathode that oppose each other and a carrier transportation layer formed to contact the luminescent layer on the cathode side, wherein the relationship of an ionization potential of the luminescent layer $Ip_{EML}$ and an ionization potential of the carrier transportation layer $Ip_{OL2}$ is $IP_{EML} < Ip_{OL2}$.

Herein, the ionization potential is the energy difference between a covalent level of a luminescent layer or a carrier transportation layer and a vacuum level and denoted by a positive value.

According to the present invention, a carrier transportation layer having an ionization potential $Ip_{OL2}$ greater than an ionization potential $IP_{EML}$ of a luminescent layer is formed on the luminescent layer on the side of a cathode. Accordingly, an energy barrier is provided at the interface through which the holes pass from the luminescent layer to the carrier transportation layer on the cathode side and the holes are stored in the luminescent layer so as to increase the hole density. As the result, holes that recombine with electrons increase so that the emission efficiency of the luminescent layer can be enhanced.

Yet another object of the present invention to provide an organic electroluminescence device, wherein the relationship between energy gaps of the luminescent layer $Eg_{EML}$ and the carrier transportation layer $Eg_{OL2}$ is $Eg_{EML} < Eg_{OL2}$.

Since a carrier transportation layer having an energy gap $Eg_{OL2}$ greater than an energy gap $Eg_{EML}$ of a luminescent layer is formed on the luminescent layer on the side of a cathode, the recombination of the holes and the electrons in the carrier transportation layer near the interface with the luminescent layer is suppressed, so that the emission efficiency of the luminescent layer can be enhanced.

Yet another object of the present invention is to provide an organic electroluminescence display with an organic electroluminescence device having a plurality of luminescent layers formed between an anode and a cathode that oppose each other and a carrier transportation layer formed to contact the luminescent layer on the anode side, characterized in that the relationship of an electron affinity of the luminescent layer $Ea_{EML}$ and an electron affinity of the carrier transportation layer $Ea_{OL1}$ is $Ea_{EML} > Ea_{OL1}$.

According to the present invention, since a carrier transportation layer having an electron affinity $Ea_{OL1}$ smaller than an electron affinity $Ea_{EML}$ of a luminescent layer is formed on the luminescent layer on the side of an anode, an energy barrier is provided at the interface through which the electrons pass from the luminescent layer to the carrier transportation layer and the electrons are stored in the luminescent layer so as to increase the spatial electron density and increase electrons that recombine with holes, so that the emission efficiency of the organic electroliminescence device can be enhanced, and then the visibility of the organic electroluminescence display can be improved and the electrical power consumption can be reduced by applying the organic electrolinescence device to the organic electroluminescence display.

BRIEF DESCRIPTION OF THE DRAWINGS

Other objects, features and advantages of the present invention will become more apparent from the following detailed description when read in conjunction with the accompanying drawings, in which:

FIG. 7 is a drawing that shows electron affinities Ea, ionization potentials Ip, and energy gaps Eg of layers used in the 1st example;

FIG. 8 is a diagram showing film structures of organic elecroluminescence devices as the 2nd and 3rd examples;

DETAILED DESCRIPTION OF THE PREFERRED EMBODIMENTS

The embodiments of the present invention are illustrated based on the drawings below.

(The 1st Embodiment)

Figure 1:
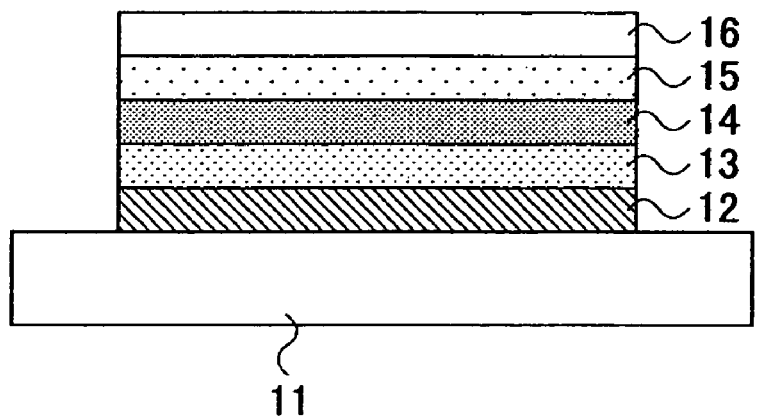
FIG. 1 is a drawing that shows a cross-sectional view of a conventional organic EL device.
Figure 2:
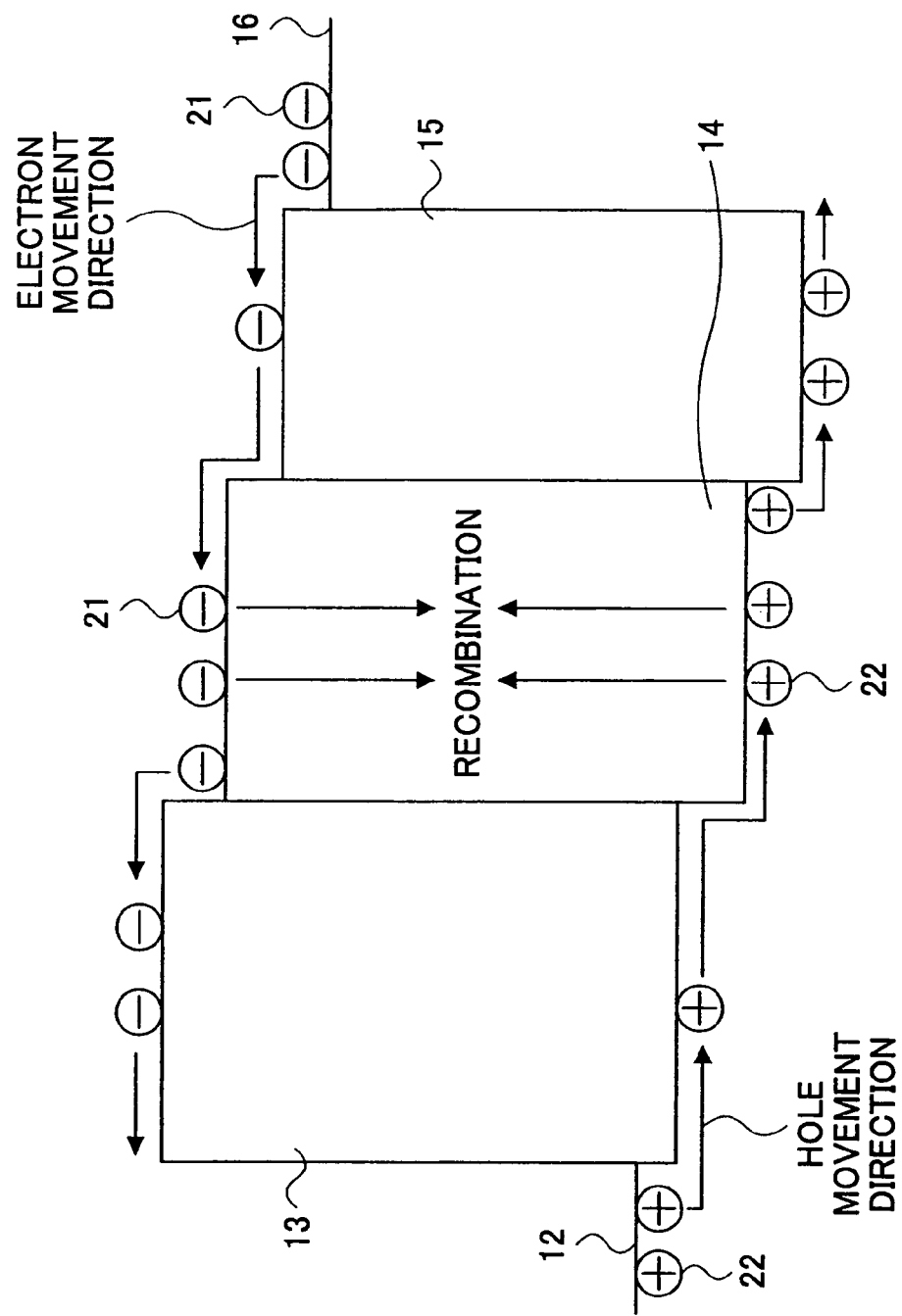
FIG. 2 is a drawing that shows an energy diagram for a conventional organic EL device.
Figure 3:
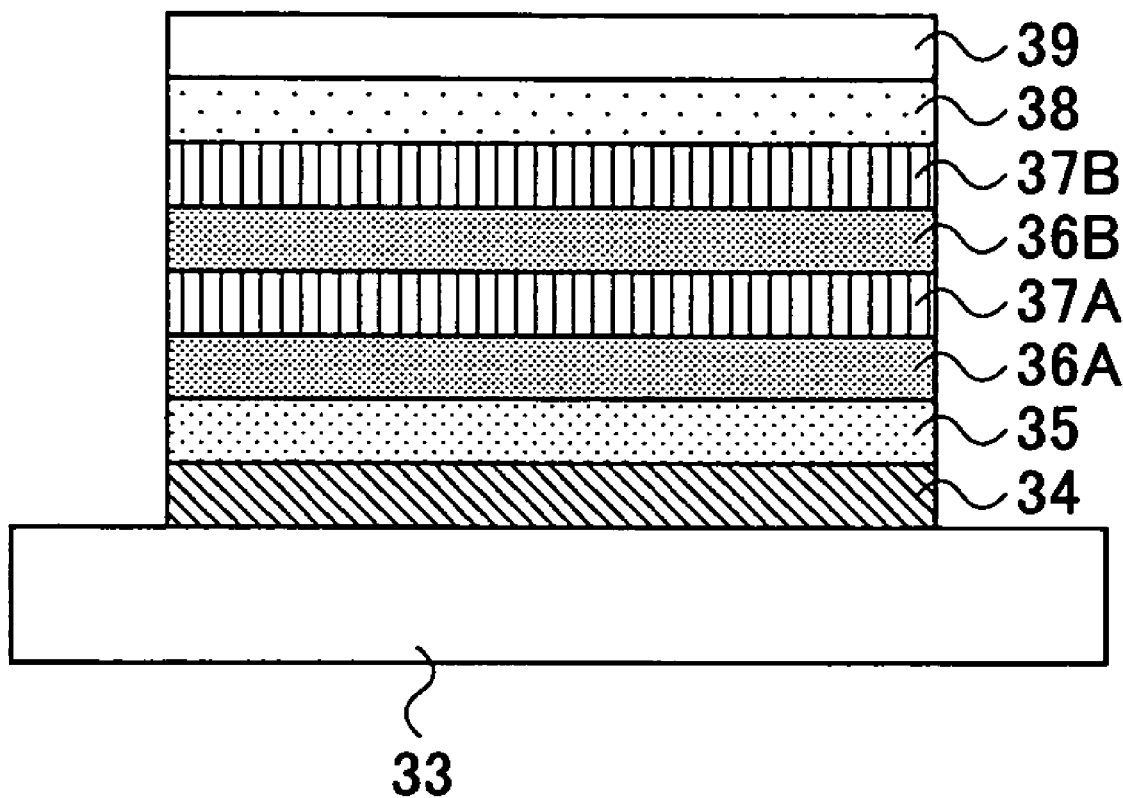
FIG. 3 is a cross-sectional view of an organic EL device as the 1st embodiment of the present invention.

FIG. 3 is a cross-sectional view of an organic EL device as the 1st embodiment. As shown in FIG. 3, an organic EL device 30 has a structure such that an anode 34, a hole injection layer 35, a first carrier transportation layer 36A, a first luminescent layer 37A, a second carrier transportation layer 36B, a second luminescent layer 37B, an electron transportation layer 38, and a cathode 39 are formed on a glass substrate 33 in order. The 1st and 2nd carrier transportation layers 36A, 36B have a smaller electron affinity Ea and a larger energy gap Eg than those of the 1st and 2nd luminescent layers, respectively.

The organic EL device 30 has a film thickness of approximately 10 nm through 1,000 nm. If it is larger than 1,000 nm, light emitted from the luminescent layers 37A, 37B is shielded, and if it is smaller than 10 nm, the thickness of the luminescent layers 37A, 37B itself is exceedingly small, so that the luminance of the luminescence is insufficient.

The anode 34 and the cathode 39 are electrodes for applying a voltage at the desired position of the organic EL device 30, wherein for the anode 34, for example, ITO, IZO (Indium Zinc Oxide), or the like can be employed and for the cathode 39, for example, an Al/LiF electrode, a Ag/Mg electrode, or the like can be employed.

For the hole injection layer 35, for example, 2-TNATA (produced by Bando Chemical Industries, Ltd.) represented by the following formula (1), m-MTDATA (produced by Bando Chemical Industries, Ltd.) represented by the following formula (2), or the like can be employed.

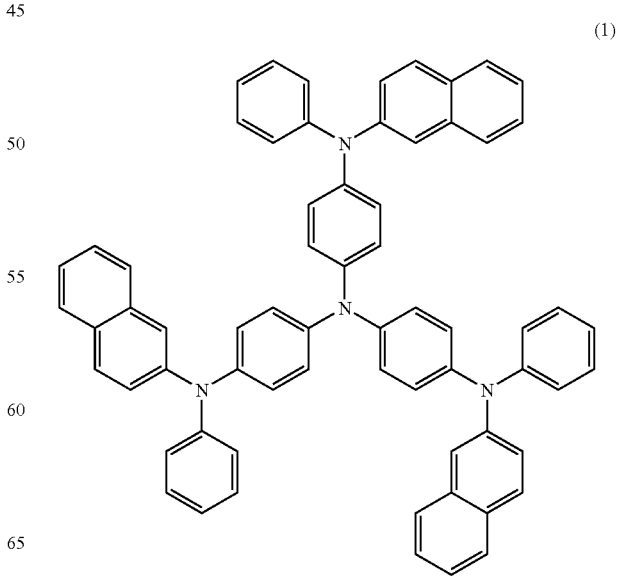

(1)

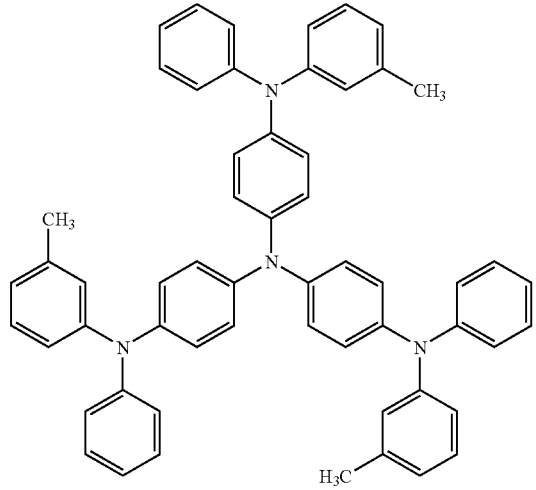

(2)

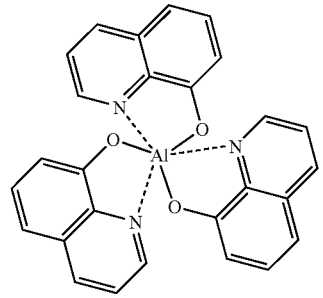

(4)

The 1st and 2nd carrier transportation layers 36A, 36B are composed of a material with high electron or hole transporting capability and, for example, α-NPD (produced by TOYO INK Co., Ltd.) represented by the following formula (3), EL-022 (produced by HODOGAYA CHEMICAL Co., Ltd.), or the like can be employed. The film thickness of the 1st and 2nd carrier transportatation layers 36A, 36B is set to be in a range of 1 nm through 100 nm and selected appropriately dependent on the number of layers that constitute the organic EL device and the total thickness of the organic EL device.

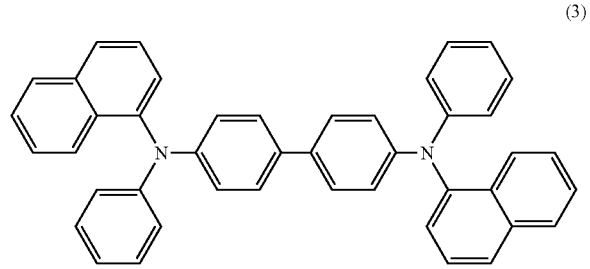

(3)

The 1st and 2nd luminescent layers contain a material for emitting luminescence with a desired color, for example, an organic phosphor such as TYG-201 (produced by TOYO INK Co., Ltd.), Alq$_3$ (tris(8-hydroxyquinolino)aluminum) represented by the following formula (4) (produced by TOYO INK Co., Ltd.), or the like can be employed. The film thickness of the 1st and 2nd luminescint layers 37A, 37B is set to be in a range of 1 nm through 100 nm and the thickness is appropriately selected similarly to the carrier transportation layers.

The electron transportation layer 38 is composed of a material with high electron transporting capability and, for example, TYE-704 (produced by TOYO INK Co., Ltd.), Alq$_3$ represented by the above formula (4) (produced by TOYO INK Co., Ltd.), or the like can be employed.

Each layer of the organic EL device 30 is formed, for example, by a vacuum deposition method at a pressure of $1.33 \times 10^{-4}$ Pa and the temperature of the glass substrate 33 being room temperature.

Figure 4:
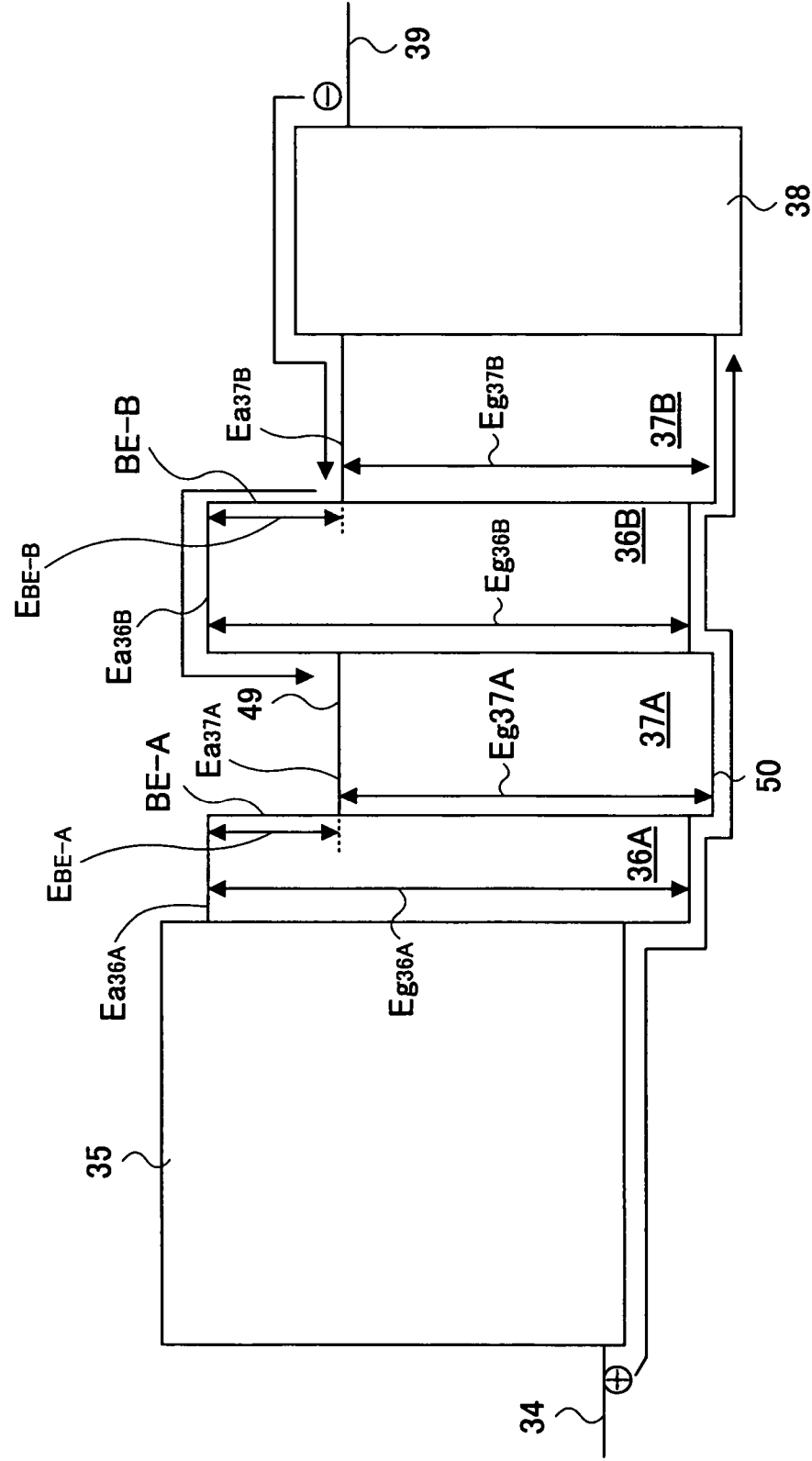
FIG. 4 is a drawing that shows an energy diagram for an organic EL device as the 1st embodiment of the present invention.

FIG. 4 is a drawing that shows an energy diagram of an organic EL device as the 1st embodiment. Ea, Eg, and Ip in FIG. 4 indicate an electron affinity Ea, an energy gap Eg, an ionization potential Ip of each layer of the organic EL device, respectively, wherein the electron affinity Ea is the difference between energies of a conduction level 49 (energy of the lowest edge of a conduction band) and a vacuum level, the energy gap Eg is the difference between energies of the conduction level 49 and a covalent level 50 (energy of the top edge of a covalent band), and the ionization potential Ip is the difference between the covalent level 50 and the vacuum level.

As shown in FIG. 4, the 1st carrier transportation layer 36A is formed on the 1st luminescent layer 37A on the side of the anode 34 and the 2nd carrier transportation layer 36B is formed on the 2nd luminescent layer 37B on the side of the anode 34, wherein as the electron affinities of the 1st luminescent layer 37A, the 2nd luminescent layer 37B, the 1st carrier transportation layer 36A, and the 2nd carrier transportation layer 36B are denoted by $Ea_{37A}$, $Ea_{37B}$, $Ea_{36A}$, and $Ea_{36B}$, respectively, and the energy gaps of the 1st luminescent layer 37A, the 2nd luminescent layer 37B, the 1st carrier transportation layer 36A, and the 2nd carrier transportation layer 36B are denoted by $Eg_{37A}$, $Eg_{37B}$, $Eg_{36A}$, and $Eg_{36B}$, respectively, the relationship of the 1st luminescent layer 37A and the 1st carrier transportation layer 36A is set to be $Ea_{37A} > Ea_{36A}$ and $Eg_{37A} < Eg_{36A}$ and the relationship of the 2nd luminescent layer 37B and the 2nd carrier transportation layer 36B is set to be $Ea_{37B} > Ea_{36B}$ and $Eg_{37B} < Eg_{36B}$. Therefore, the organic EL device shown in FIG. 4 has the 1st carrier transportation layer 36A/the 1st luminescent layer 37A and the 2nd carrier transportation layer 36B/the 2nd luminescent layer 37B and thus double stacking structures each composed of a carrier transportation layer/a luminescent layer are formed.

The flow of electrons is illustrated. The electrons pass from the cathode 39 through the electron transportation layer 38 toward the anode 34 and reach to the 2nd luminescent layer 37B. Herein, while the electrons recombine with holes, unrecombined electrons tend to flow from the 2nd luminescent layer 37B into the 2nd carrier transportation layer 36B on the side of the anode 34. However, an energy barrier BE-B is provided at the interface between the 2nd luminescent layer 37B and the 2nd carrier transportation layer 36B.

The height of $E_{BE-B}$ of the energy barrier BE-B is the difference between the electron affinity $Ea_{36B}$ of the 2nd carrier transportation layer 36B and the electron affinity $Ea_{37B}$ of the 2nd luminescent layer 37B, that is, $E_{BE-B}=Ea_{37B}-Ea_{36B}$. Since $Ea_{37B}>Ea_{36B}$ is set, $E_{BE-B}>0$. Therefore, the electrons are stored in the 2nd luminescent layer 37B and the spatial electron density increases, so that the emission efficiency of the 2nd luminescent layer 37B can be enhanced. Furthermore, the energy barrier BE-B is preferably greater than 0.1 V.

Also, as the spatial electron density of the 2nd luminescent layer 37B increases, the probability of the recombination of electrons and holes is enhanced due to the increase of the spatial electron density even at the interface between the 2nd carrier transportation layer 36B and the 2nd luminescent layer 37B. However, since the energy gap $Eg_{36B}$ of the 2nd carrier transportation layer 36B is greater than the energy gap $Eg_{37B}$ of the 2nd luminescent layer 37B, the recombination in the 2nd carrier transportation layer 36B is suppressed.

Next, electrons flowing toward the side of the anode 34 without the recombination in the 2nd luminescent layer 37B are also stored in the 1st luminescent layer, similarly to the aforementioned storage of electrons in the 2nd luminescent layer 37B. That is, an energy barrier BE-A is provided at the interface between the 1st luminescent layer 37A and the 1st carrier transportation layer 36A. The height of $E_{BE-A}$ of the energy barrier BE-A is the difference between the electron affinity $Ea_{36A}$ of the 1st carrier transportation layer 36A and the electron affinity $Ea_{37A}$ of the 1st luminescent layer 37A, that is, $E_{BE-A}=Ea_{37A}-Ea_{36A}$. Since $Ea_{37A}>Ea_{36A}$ is set, $E_{BE-A}>0$. Therefore, the electrons are stored in the 1st luminescent layer 37A and the spatial electron density increases, so that the emission efficiency of the 1st luminescent layer 37A can be enhanced. Additionally, the energy barrier BE-A is preferably greater than 0.1 V.

Also, since the energy gaps $Eg_{37A}$, $Eg_{36A}$ of the 1st luminescent layer 37A and the 1st carrier transportation layer 36A are in a similar relation, the recombination in the 1st carrier transportation layer 36A is suppressed.

According to the present embodiment, since double stacking structures composed of a carrier transportation layer/a luminescent layer are formed in the aforementioned organic EL device, two energy barriers BE-B, BE-A are provided at the interfaces between the carrier transportation layer and the luminescent layer and electrons are stored in the 2nd luminescent layer 37B by the energy barrier BE-B and recombine with holes so as to enhance the emission efficiency of the 2nd luminescent layer 37B, while electrons flowing toward the side of the anode 34 without recombining with holes in the 2nd luminescent layer 37B are stored in the 1st luminescent layer 37A by the energy barrier BE-A and recombine with holes so as to enhance the emission efficiency of the 1st luminescent layer 37A, so that the total emission efficiency of the organic EL device can be enhanced. Additionally, the total emission efficiency of the organic EL device can be enhanced by forming a further stacking structure composed of a carrier transportation layer/a luminescent layer so as to increase the number of energy barriers.

1ST EXAMPLE

An organic EL device 30 as the 1st example was produced as follows. On a glass substrate 33, an ITO electrode as an anode 34, a 2-TNATA layer with a film thickness of 50 nm as a hole injection layer 35, an α-NPD layer with a film thickness of 10 nm as a 1st carrier transportation layer 36A, a non-doped-type greenly luminescent TYG-201 layer with a film thickness of 20 nm as a 1st luminescent layer 37A, an α-NPD layer with a film thickness of 20 nm as a 2nd carrier transportation layer 36B, a non-doped-type greenly luminescent TYG-201 layer with a film thickness of 20 nm as a 2nd luminescent layer 37B, a TYE-704 layer with a film thickness of 30 nm as a electron transportation layer 38, an Al/LiF stacking film as a cathode 39 which is composed of a lithium fluoride film with a film thickness of 0.5 nm and an Al film with a film thickness of 100 nm were formed in order by using a vacuum deposition method.

Now, a method for measuring an energy gap Eg and an ionization potential Ip important for implementing the present invention is illustrated.

The energy gap Eg was measured by irradiating a thin film as each layer of the organic EL device 30 formed independently using a method similar to the method for forming the organic EL device 30 with light in an ultraviolet through visible region in the atmosphere, with the use of a spectrophotometric apparatus capable of obtaining a light absorption spectrum in a measurement, for example, Spectrophotometer U-4100 produced by Hitachi, Ltd.

Figure 5:
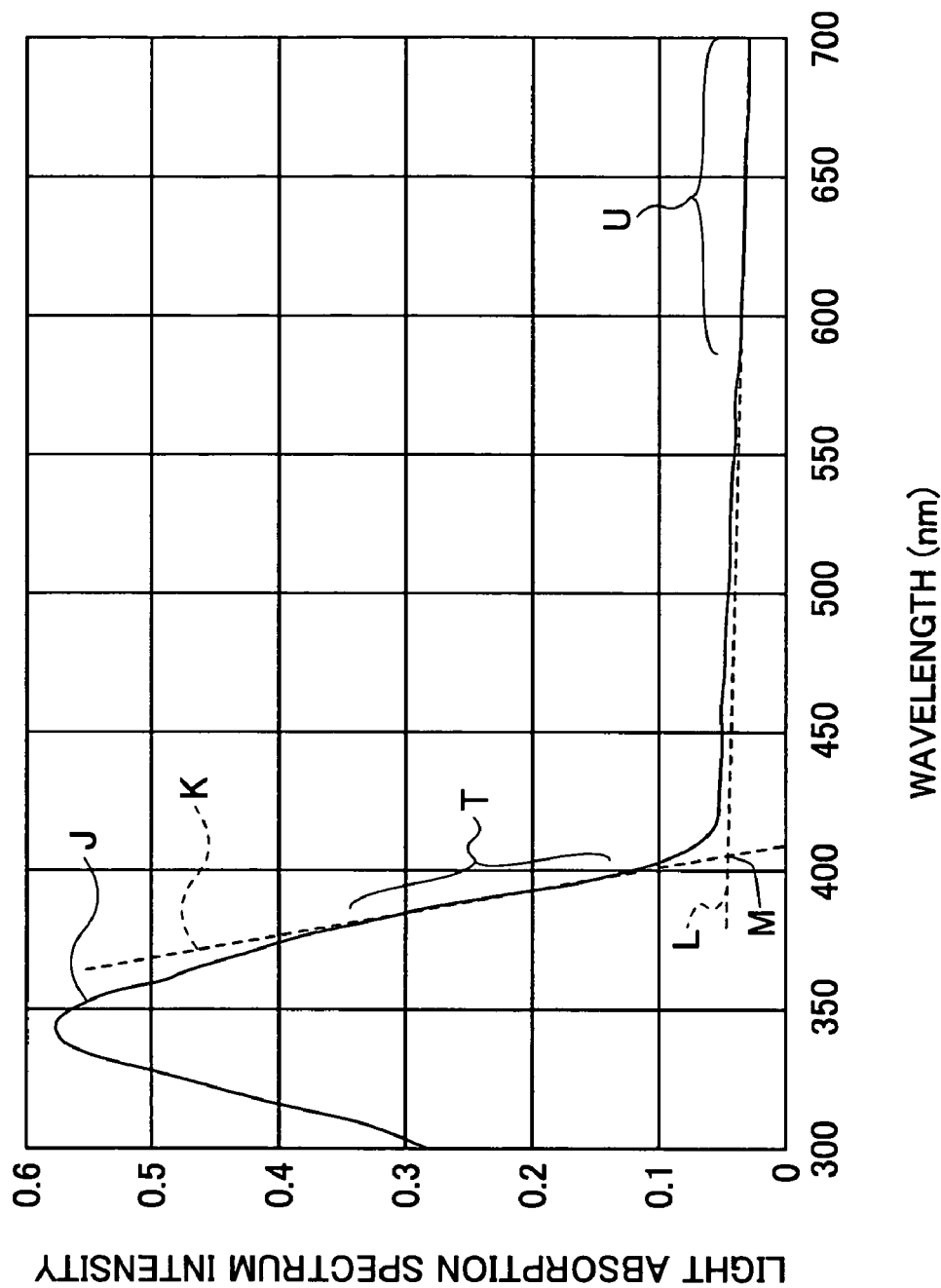
FIG. 5 is a drawing that indicates the wavelength dependency of a light absorption spectrum.

FIG. 5 is a drawing that indicates the wavelength dependency of the light absorption spectrum. A curved line J shows the light absorption spectrum as a measurement result in FIG. 5. Additionally, a range T shows a portion such that the curved line J is substantially linear in an intensity rising portion of the light absorption spectrum. A range U shows a portion such that the curved line J is substantially linear in a no-absorption wavelength region of the light absorption spectrum. A straight line K is a line drawn as overlapping with the curved line J in the range T. A straight line L is a line drawn as overlapping with the curved line J in the range U. The energy gap Eg is obtained from an intersection point M of the straight line K and the straight line L.

The ionization potential Ip is obtained from a measurement of the number of photoelectrons emitted by irradiating a thin film formed similarly to the thin film used for the measurement of the energy gap Eg with ultraviolet rays in the atmosphere using an atmospheric ultraviolet photoelectron analyzing apparatus, for example, AC-1 produced by Riken Keiki Co., Ltd. and a relation of the energy of ultraviolet rays and the square root of the number of the emitted photoelectrons. As the measurement conditions of the AC-1 produced by Riken Keiki Co., Ltd., the energy range of the ultraviolet rays is 3.8 through 6.2 eV and the intensity of the ultraviolet rays is 20 nW. The film thickness of the thin film was 50 nm.

Figure 6:
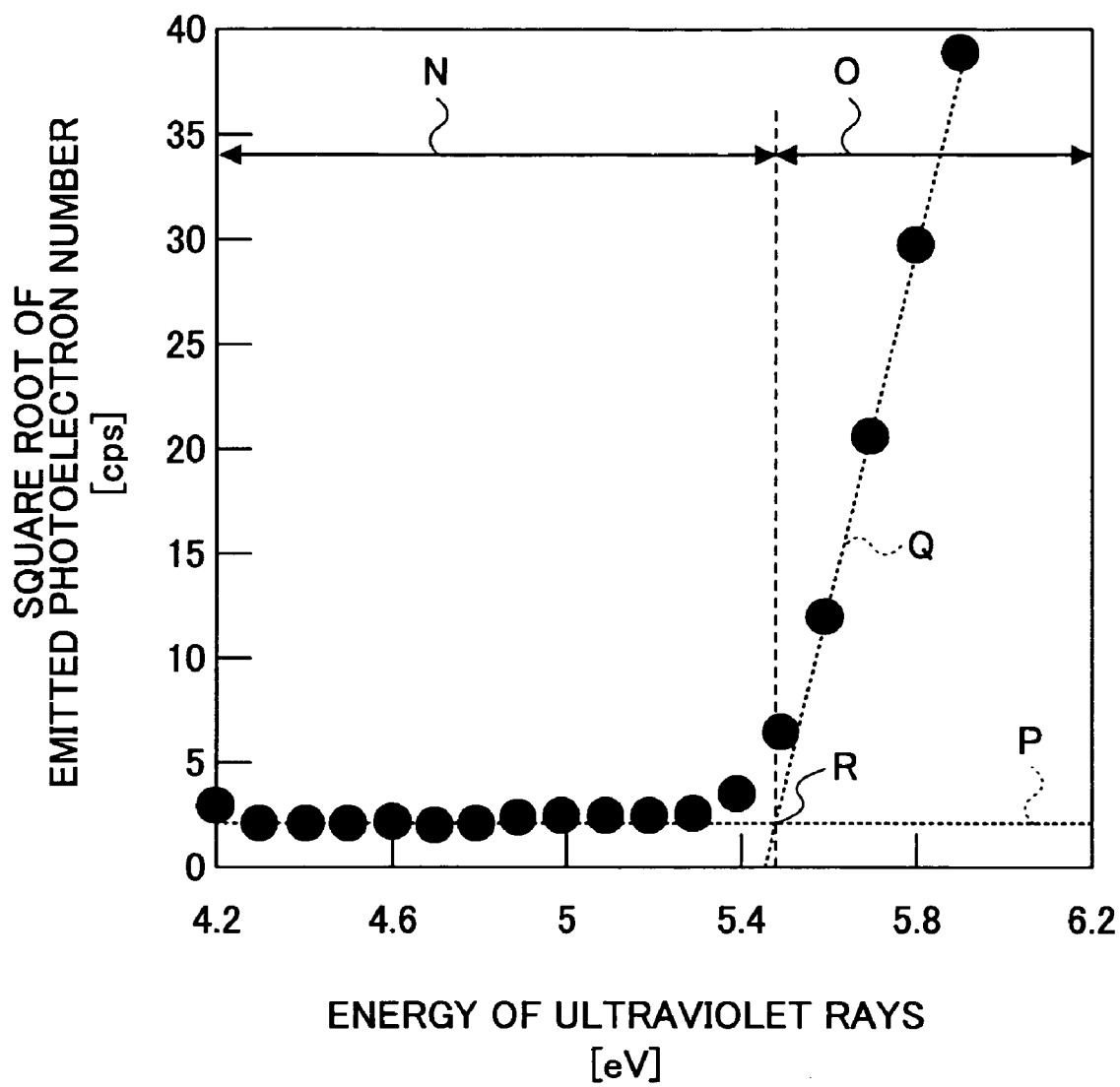
FIG. 6 is a drawing that indicates the relationship of the energy of ultraviolet rays and the square root of the number of emitted photoelectrons.

FIG. 6 is a drawing that indicates the relationship of the energy of ultraviolet rays and the square root of the number of emitted photoelectrons. The number of emitted photoelectrons depends on the energy value of ultraviolet rays, and although the photoelectrons are not emitted in a range N shown in FIG. 6 since the energy of the ultraviolet rays is low, the photoelectrons are excited to an energy level higher than the vacuum level so as to emit the photoelectrons in a range O since the energy of the ultraviolet rays is sufficiently high. A straight line P shown in FIG. 6 indicates an approximation line drawn by a least-squares method with respect to ultraviolet energy of 4.2 eV through 5.3 eV. A straight line Q indicates an approximation line drawn by a least-squares method with respect to ultraviolet energy of 5.6 eV through 5.9 eV.

An intersection point R of the straight line P and the straight line Q indicates threshold energy for the photoelectron emission and the threshold energy for the photoelectron emission is the ionization potential Ip. The electron affinity Ea is obtained from the difference between the ionization potential Ip and the energy gap Eg (Ea=Ip−Eg).

FIG. 7 is a drawing that shows electron affinities Ea, ionization potentials Ip, and energy gaps Eg of layers used as the 1st example. As shown in FIG. 7, the electron affinity Ea of the α-NPD layers used as the 1st and 2nd carrier transportation layers 36A, 36B is 2.42 eV and the electron affinity Ea of the TYG-201 layers used as the 1st and 2nd luminescent layers 37A, 37B is 3.20 eV. Due to the difference between the electron affinities Ea of the α-NPD layer and the TYG-201 layer, energy barriers of 0.78 eV are provided at the interface between the 1st luminescent layer 37A and the 1st carrier transportation layer 36A and the interface between the 2nd luminescent layer 37B and the 2nd carrier transportation layer 36B.

By the energy barriers, electrons are stored in TYG-201 layers used in the 1st and 2nd luminescent layers 37A, 37B so as to increase the spatial electron density, whereby electrons that recombine with holes increase, so that the emission efficiency of the 1st and 2nd luminescent layers 37A, 37B can be enhanced. Also, since the energy gap Eg, 3.04 eV, of the α-NPD layer used for the 1st and 2nd carrier transportation layers 36A, 36B is greater than the energy gap Eg, 2.40 eV, of the TYG-201 layer used for the 1st and 2nd luminescent layers 37A, 37B, the probability of the recombination of the electrons and the holes in the 1st and 2nd luminescent layers 37A, 37B increases, so that the emission efficiency of the TG-201 layers used as the 1st and 2nd luminescent layers 37A, 37B can be enhanced.

Furthermore, even if the 1st carrier transportation layer 36A is not formed, since the electron affinity Ea, 2.19 eV, of the 2-TNATA layer used as the hole injection layer 35 is smaller than the electron affinity Ea, 3.20 eV, of the TYG-201 layer used as the 1st luminescent layer, an energy barrier is formed between the 2-TNATA layer and the TYG-201 layer, so that the emission efficiency can be enhanced.

2ND AND 3RD EXAMPLES

FIG. 8 is a drawing that shows layer structures of organic EL devices as the 2nd and 3rd examples.

The 2nd and 3rd examples are such that a carrier transportation layer and a luminescent layer are further stacked between the 2nd luminescent layer 37B and the cathode 39 in the 1st example. In the 2nd example, a set of a carrier transportation layer and a luminescent layer was further formed compared to the 1st example, and in the 3rd example, two sets of a carrier transportation layer and a luminescent layer were further formed compared to the 2nd example. Additionally, the film thickness of each layer is decided dependent on the total thickness of the organic EL device.

According to the 2nd and 3rd examples, since the carrier transportation layer and the luminescent layer are further stacked, more electrons and holes contribute to the recombination, so that the emission efficiency of the whole of the organic EL device can be enhanced.

[Evaluation of the Luminance of Luminescence]

Next, the luminance of luminescence from the organic EL devices as the 1st, 2nd, and 3rd examples was evaluated. As a comparison example that is not in accordance with the present invention, an organic EL device with only one luminescent layer was evaluated. The organic EL device as the comparison example had a structure such that an ITO electrode as an anode, a 2-TNATA layer with a film thickness of 50 nm as a hole injection layer, an α-NPD layer with a film thickness of 50 nm as a hole injection layer, a non-doped-type greenly luminescent TYG-201 layer with a film thickness of 20 nm as a luminescent layer, a TYE-704 layer with a film thickness of 30 nm as a electron transportation layer, and an Al/LiF electrode were formed on a glass substrate in order by using a vacuum deposition method. With respect to the pressure inside the vacuum deposition apparatus and the temperature of the glass substrate 33, the pressure was $1.33 \times 10^{-4}$ Pa and the temperature of the glass substrate was room temperature.

Next, the emission efficiency of the organic EL devices as the 1st through 3rd examples and the comparison example was examined at an electric current density of 50 mA/cm$^2$.

Figures 9, 10:
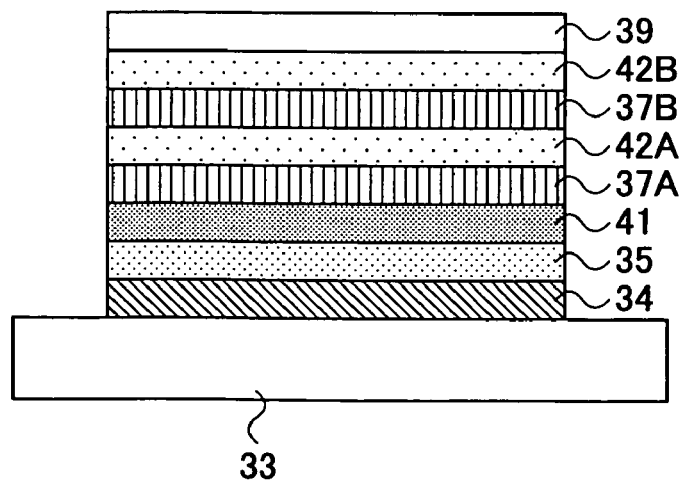
FIG. 9 is a drawing that shows the luminance of luminescence from the organic electroluminescence devices at a current density of 50 mA/cm$^2$.
FIG. 10 is a cross-sectional view of an organic EL device as the 2nd embodiment of the present invention.

FIG. 9 is a drawing that shows the luminance of luminescence from the organic EL devices at an electric current density of 50 mA/cm$^2$. As shown in FIG. 9, it was 3,800 cd/m$^2$ in regard to the organic EL device as the 1st example, 3,900 cd/m$^2$ in regard to the organic EL device as the 2nd example, and 4,010 cd/m$^2$ in regard to the organic EL device as the 3rd example, resulting in all being higher than the luminance of luminescence from the organic EL device as the comparison example being 3,100 cd/m$^2$.

According to the 1st through 3rd examples, it is understood that the more the number of sets of stacking layers composed of a luminescent layer and a carrier transportation layer formed on the side of an anode is, the higher the luminance of luminescence is.

(2nd Embodiment)

FIG. 10 is a cross-sectional view of an organic EL device as the 2nd embodiment. As shown in FIG. 10, an organic EL device 40 has a structure such that an anode 34, a hole injection layer 35, a hole transportation layer 41, a 1st luminescent layer 37A, a 1st carrier transportation layer 42A, a 2nd luminescent layer 37B, a 2nd carrier transportation layer 42B, and a cathode 39 composed of a lithium fluoride film with a film thickness of 0.5 nm and an aluminum film with a film thickness of 100 nm are formed on a glass substrate 33 in order. The 1st and 2nd carrier transportation layers 42A, 42B have a greater ionization potential Ip and a greater energy gap Eg than those of the 1st and 2nd luminescent layers.

The 1st and 2nd carrier transportation layers 42A, 42B composed of a material with high electron or hole transportation capability and, for example, TYE-704 (produced by TOYO INK Co., Ltd.), Alq$_3$ (produced by TOYO INK Co., Ltd.), or the like can be employed. The film thickness of the 1st and 2nd carrier transportation layers 42A, 42B is set to be in a range of 1 nm through 100 nm and selected appropriately dependent on the number of layers that constitute the organic EL device and the total thickness of the organic EL device.

The 1st and 2nd luminescent layers 37A, 37B contain a material for emitting luminescence with a desired color, for example, an organic phosphor, and for example, TYG-201 (produced by TOYO INK Co., Ltd.) can be employed. The film thickness of the 1st and 2nd luminescent layers 37A, 37B is set to be in a range of 1 nm through 100 nm and the thickness is appropriately selected similarly to the carrier transportation layers.

Each layer of the organic EL device 40 is formed, for example, by a vacuum deposition method at a pressure of $1.33 \times 10^{-4}$ Pa and the temperature of the glass substrate 33 being room temperature.

Figure 11:
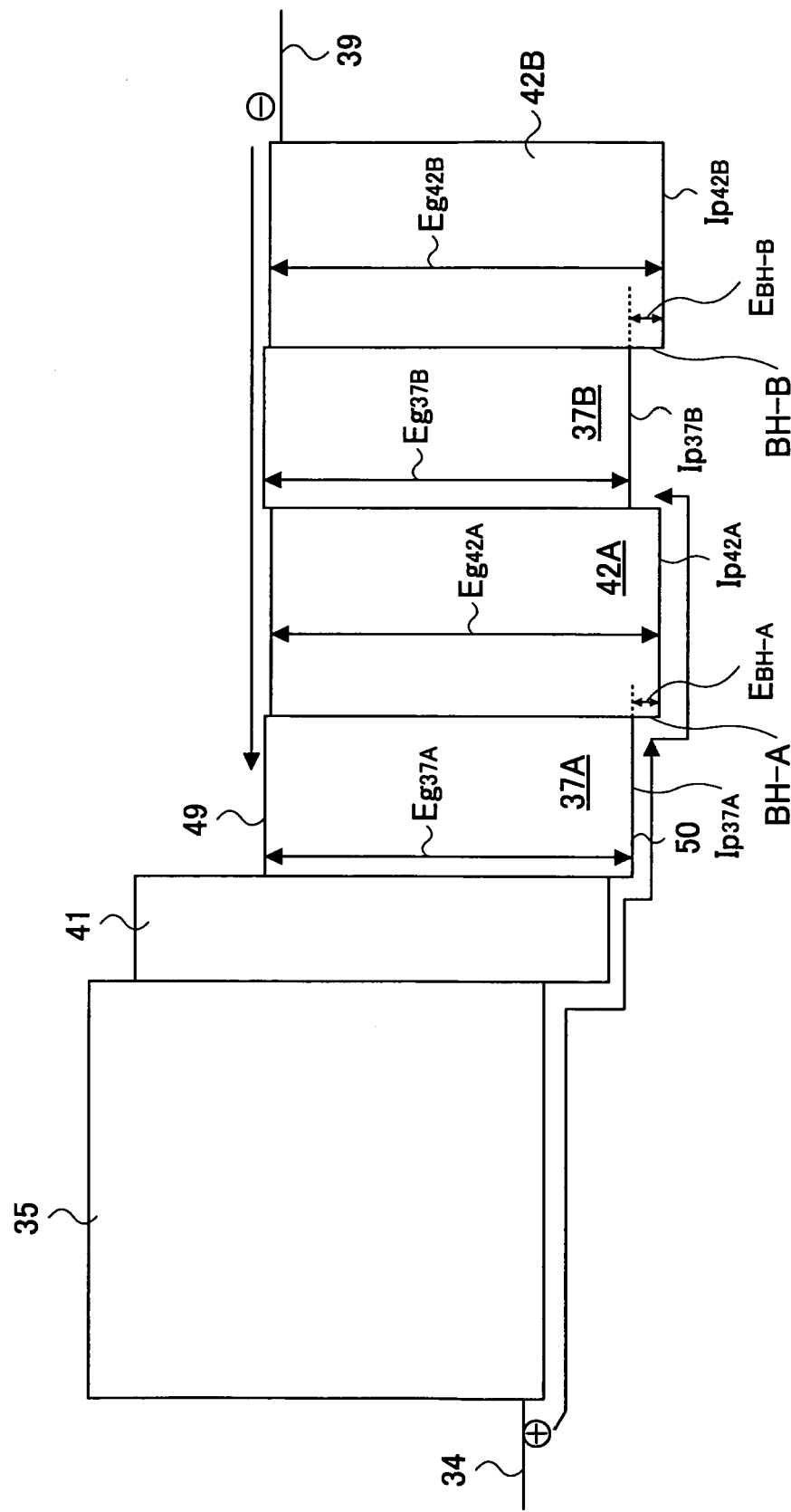
FIG. 11 is a drawing that shows an energy diagram for an organic EL device as the 2nd embodiment.

FIG. 11 is a drawing that shows an energy diagram of the organic EL device as the 2nd embodiment. As shown in FIG. 11, the 1st carrier transportation layer 42A is formed on the 1st luminescent layer 37A on the side of the cathode 39 and the 2nd carrier transportation layer 42B is formed on the 2nd luminescent layer 37B on the side of the cathode 39. As the ionization potentials of the 1st luminescent layer 37A, the 2nd luminescent layer 37B, the 1st carrier transportation layer 42A, and the 2nd carrier transportation layer 42B are denoted by $Ip_{37A}$, $Ip_{37B}$, $Ip_{42A}$, and $Ip_{42B}$, respectively, and the energy gaps of the 1st luminescent layer 37A, the 2nd luminescent layer 37B, the 1st carrier transportation layer 42A, and the 2nd carrier transportation layer 42B are denoted by $Eg_{37A}$, $Eg_{37B}$, $Eg_{42A}$, and $Eg_{42B}$, respectively, the relationship of the 1st luminescent layer 37A and the 1st carrier transportation layer 42A is set to be $Ip_{37A}<Ip_{42A}$ and $Eg_{37A}<Eg_{42A}$, and the relationship of the 2nd luminescent layer 37B and the 2nd carrier transportation layer 42B is set to be $Ip_{37B}<Ip_{42B}$ and $Eg_{37B}<Eg_{42B}$. Therefore, the organic EL device shown in FIG. 11 has the 1st luminescent layer 37A/the 1st carrier transportation layer 42A and the 2nd luminescent layer 37B/the 2nd carrier transportation layer 42B and thus double stacking structures each composed of a luminescent layer/a carrier transportation layer are formed.

The flow of holes is illustrated. The holes pass from the anode 34 through the hole injection layer 35 and the hole transportation layer 41 toward the cathode 39 and reach the 1st luminescent layer 37A. Herein, while the holes recombine with electrons, unrecombined holes tend to flow from the 1st luminescent layer 37A into the 1st carrier transportation layer 42A on the side of the cathode 39. However, an energy barrier BH-A is provided at the interface between the 1st luminescent layer 37A and the 1st carrier transportation layer 42A. The height of $E_{BH-A}$ of the energy barrier BH-A is set to be the difference between the ionization potential $Ip_{42A}$ of the 1st carrier transportation layer 42A and the ionization potential $Ip_{37A}$ of the 1st luminescent layer 37A, that is, $E_{BH-A}=Ip_{42A}-Ip_{37A}$. Since $Ip_{42A}>Ip_{37A}$ is set, $E_{BH-A}>0$. Therefore, the holes are stored in the 1st luminescent layer 37A and the hole density increases, so that the emission efficiency of the 1st luminescent layer 37A can be enhanced. Furthermore, the energy barrier BH-A is preferably greater than 0.1 V.

Also, as the hole density of the 1st luminescent layer 37A increases, the probability of the recombination of holes and electrons is enhanced due to the increase of the spatial hole density even at the interface between the 1st carrier transportation layer 42A and the 1st luminescent layer 37A. However, since the energy gap $Eg_{42A}$ Of the 1st carrier transportation layer 42A is greater than the energy gap $Eg_{37A}$ of the 1st luminescent layer 37A, the recombination in the 1st carrier transportation layer 42A is suppressed.

Next, holes flowing toward the side of the cathode 39 without recombination in the 1st luminescent layer 37A are also stored in the 2nd luminescent layer 37B, similarly to the aforementioned storage of holes in the 1st luminescent layer 37A. That is, an energy barrier BH-B is provided at the interface between the 2nd luminescent layer 37B and the 1st carrier transportation layer 42B. The height of $E_{BH-B}$ of the energy barrier BH-B is the difference between the ionization potential $Ip_{42B}$ of the 2nd carrier transportation layer 42B and the ionization potential $Ip_{37B}$ of the 2nd luminescent layer 37B, that is, $E_{BH-B}=Ip_{42B}-Ip_{37B}$. Since $Ip_{42B}>Ip_{37B}$ is set, $E_{BH-B}>0$. Therefore, the holes are stored in the 2nd luminescent layer 37B and the hole density increases, so that the emission efficiency of the 2nd luminescent layer 37B can be enhanced. Furthermore, the energy barrier BH-B is preferably greater than 0.1 V.

Also, since the energy gaps $Eg_{37B}$, $Eg_{42B}$ Of the 2nd luminescent layer and the 2nd carrier transportation layer 42B are in a similar relation, the recombination in the 2nd carrier transportation layer 42B is suppressed.

According to the present embodiment, since double stacking structures composed of a carrier transportation layer and a luminescent layer are formed in the aforementioned organic EL device, two energy barriers BH-B, BH-A are provided at the interfaces between the carrier transportation layers/the luminescent layers, and holes are stored in the 1st luminescent layer 37A by the energy barrier BH-A and recombine with electrons so as to enhance the emission efficiency of the 1st luminescent layer 37A while holes flowing toward the side of the cathode 39 without recombining with electrons in the 1st luminescent layer 37A are stored in the 2nd luminescent layer 37B by the energy barrier BH-B and recombine with electrons so as to enhance the emission efficiency of the 2nd luminescent layer 37B, so that the total emission efficiency of the organic EL device can be enhanced. Additionally, the total emission efficiency of the organic EL device can be further enhanced by forming a further stacking structure composed of a carrier transportation layer/a luminescent layer so as to increase the number of energy barriers.

4TH EXAMPLE

An organic EL device as the 4th example was made as follows. On a glass substrate 33, an ITO electrode as an anode 34, a 2-TNATA layer with a film thickness of 50 nm as a hole injection layer 35, an α-NPD layer with a film thickness of 10 nm as a hole transportation layer 41, a 1st non-doped-type greenly luminescent TYG-201 layer with a film thickness of 20 nm as a 1st luminescent layer 37A, a TYE-704 layer with a film thickness of 30 nm as a 1st carrier transportation layer 42A, a 2nd non-doped-type greenly luminescent TYG-201 layer with a film thickness of 20 nm as a 2nd luminescent layer 37B, a TYE-704 layer with a film thickness of 30 nm as a 2nd carrier transportation layer 42B, and an Al/LiF stacking film as a cathode 39 which is composed of a lithium fluoride film with a film thickness of 0.5 nm and an Al film with a film thickness of 100 nm were formed in order by using a vacuum deposition method.

Figures 12, 13:
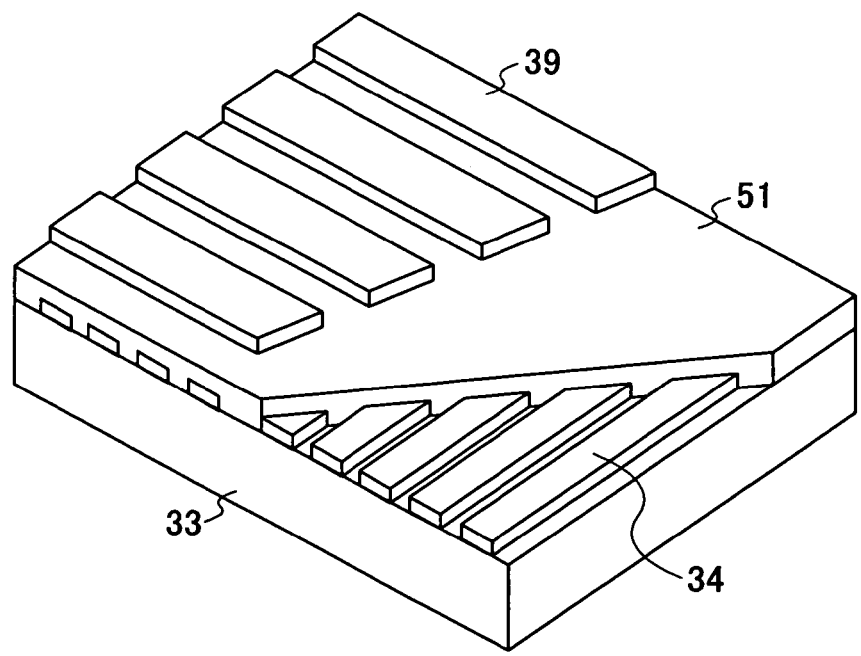
FIG. 12 is a drawing that indicates the relationship of electron affinities Ea, ionization potentials Ip, and energy gaps Eg of layers used in the 4th example.
FIG. 13 is a perspective view that shows the general structure of an organic electroluminescence display as the 3rd embodiment of the present invention.

FIG. 12 is a drawing that indicates the relation of electron affinities Ea, ionization potentials Ip, and energy gaps Eg of layers used in the 4th example. Additionally, the measurement of the ionization potential Ip and the energy gap Eg were obtained by the method explained in example 1. Also, α-NPD has the Ea, Eg, and Ip shown in FIG. 7.

As shown in FIG. 12, the ionization potential Ip of the TYG-201 layers used as the 1st and 2nd luminescent layers 37A, 37B is 5.60 eV and the ionization potential Ip of the TYE-704 layers used as the 1st and 2nd carrier transportation layers is 5.73 eV. Due to the difference between the ionization potentials Ip of the TYE-704 layer and the TYG-201 layer, energy barriers of 0.13 eV are provided at the interface between the 1st luminescent layer 37A and the 1st carrier transportation layer 42A and the interface between the 2nd luminescent layer 37B and the 2nd carrier transportation layer 42B.

By the energy barriers, holes are stored in TYG-201 layers used in the 1st and 2nd luminescent layers 37A, 37B so as to increase the hole density, whereby holes that recombine with electrons increase, so that the emission efficiency of the 1st and 2nd luminescent layers 37A, 37B can be enhanced. Furthermore, since the energy gap Eg, 2.76 eV, of the TYE-704 layer used for the 1st and 2nd carrier transportation layers 42A, 42B is greater than the energy gap Eg, 2.40 eV, of the TYG-201 layer used for the 1st and 2nd luminescent layers 37A, 37B, the probability of the recombination of the holes and the electrons in the 1st and 2nd luminescent layers 37A, 37B increases, so that the emission efficiency of the TG-201 layers used as the 1st and 2nd luminescent layers 37A, 37B can be enhanced.

(3rd Embodiment)

FIG. 13 is a perspective view that shows a general structure of an organic electroluminescence display (organic EL display) as the 3rd embodiment of the present invention.

As shown in FIG. 13, an organic EL display 60 has a structure such that Al/LiF electrodes as cathodes 39 and ITO electrodes as anodes 34 are formed orthogonally on a glass substrate 33 and a stack 51 that constitutes an organic EL device as the 1st or 2nd embodiment is formed therebetween. The emission from the organic EL device 60 is carried out by applying a voltage between an ITO electrode and an Al/LiF electrode, in a region of a luminescent layer that is desired to emit luminescence, which are specified respectively. Since the aforementioned structure is applied to the organic EL display 60, the emission efficiency can be enhanced.

According to the present invention, since a carrier transportation layer having an electron affinity $Ea_{OL1}$ smaller than an electron affinity $Ea_{EML}$ of a luminescent layer is formed on the luminescent layer on the side of an anode, whereby an energy barrier is provided at the interface through which electrons pass from the luminescent layer to the carrier transportation layer and the electrons are stored in the luminescent layer so as to increase the spatial electron density, electrons that recombine with holes increase, so that the emission efficiency of the luminescent layer can be enhanced.

Although the preferred embodiments of the present invention are described above in detail, the present invention is not limited to such specific embodiments but variations and modifications can be made within the scope of the present invention specified in the claims.

For example, the 1st embodiment and the 2nd embodiment can be combined.

What is claimed is:

1. An organic electroluminescence device with a plurality of luminescent layers formed between an anode and a cathode that oppose each other and corresponding carrier transportation layers formed so as to contact each luminescent layer on the anode side, wherein
    a relationship of an electron affinity $Ea_{EML}$ of each luminescent layer and an electron affinity $Ea_{OL1}$ of the corresponding carrier transportation layer is $Ea_{EML} > Ea_{OL1}$,
    and a relationship of an ionization potential $IP_{EML}$ of each luminescent layer and an ionization potential $Ip_{OL1}$ of the corresponding carrier transportation layer is $IP_{EML} > IP_{OL1}$.

2. The organic electroluminescence device as claimed in claim 1, wherein αNPD is employed as a material of each carrier transportation layer.

3. The organic electroluminescence device as claimed in claim 1, wherein a relationship of an energy gap $Eg_{EML}$ of each luminescent layer and an energy gap $Eg_{OL1}$ of the corresponding carrier transportation layer is $Eg_{EML} < Eg_{OL1}$.

4. An organic electroluminescence display with an organic electroluminescence device having a plurality of luminescent layers formed between an anode and a cathode that oppose each other and corresponding carrier transportation layers formed so as to contact each luminescent layer on the anode side, wherein
    a relationship of an electron affinity $Ea_{EML}$ of each luminescent layer and an electron affinity $Ea_{OL1}$ of the corresponding carrier transportation layer is $Ea_{EML} > Ea_{OL1}$,
    and a relationship of an ionization potential $IP_{EML}$ of each luminescent layer and an ionization potential $IP_{OL1}$ of the corresponding carrier transportation layer is $IP_{EML} > IP_{OL1}$.

* * * * *